United States Patent
Yang et al.

(10) Patent No.: US 11,579,221 B2
(45) Date of Patent: Feb. 14, 2023

(54) MONITORING METHOD AND DEVICE FOR MAGNETIC RESONANCE IMAGING SYSTEM AND MAGNETIC RESONANCE IMAGING SYSTEM

(71) Applicant: GE Precision Healthcare LLC, Wauwatosa, WI (US)

(72) Inventors: Fan Yang, Wauwatosa, WI (US); Yanchun Zheng, Wauwatosa, WI (US); Kun Wang, Wauwatosa, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/305,912

(22) Filed: Jul. 16, 2021

(65) Prior Publication Data

US 2022/0026509 A1 Jan. 27, 2022

(30) Foreign Application Priority Data

Jul. 21, 2020 (CN) .......................... 202010705119.4

(51) Int. Cl.
*G01R 33/28* (2006.01)
*G01R 33/54* (2006.01)

(52) U.S. Cl.
CPC ......... *G01R 33/288* (2013.01); *G01R 33/543* (2013.01)

(58) Field of Classification Search
None
See application file for complete search history.

(56) References Cited

U.S. PATENT DOCUMENTS

| | | | |
|---|---|---|---|
| 7,609,063 B2 | 10/2009 | Xue et al. | |
| 2011/0263969 A1* | 10/2011 | Fontius | A61B 5/01 600/412 |
| 2016/0146910 A1* | 5/2016 | Kaneko | A61B 5/055 324/309 |
| 2017/0097396 A1* | 4/2017 | Harvey | G01R 33/583 |
| 2019/0086499 A1* | 3/2019 | Ohishi | G01R 33/385 |
| 2019/0383889 A1* | 12/2019 | Wang | A61B 5/055 |
| 2021/0298606 A1* | 9/2021 | Kocaturk | A61B 5/055 |
| 2022/0034987 A1* | 2/2022 | Gumbrecht | G01R 33/288 |

FOREIGN PATENT DOCUMENTS

| | | |
|---|---|---|
| CN | 101556313 B | 8/2012 |
| WO | 2019089372 A1 | 5/2019 |

* cited by examiner

*Primary Examiner* — Rodney E Fuller (57) ABSTRACT

A monitoring method and device for a magnetic resonance imaging system comprises: acquiring a whole body specific absorption rate of a subject under examination; acquiring a ratio between a local region specific absorption rate and the whole body specific absorption rate of the subject under examination on the basis of current parameter information of a local coupling coil in the magnetic resonance imaging system; and calculating the local region specific absorption rate of the subject under examination on the basis of the ratio between the local region specific absorption rate and the whole body specific absorption rate, and the whole body specific absorption rate.

22 Claims, 6 Drawing Sheets

MONITORING METHOD AND DEVICE FOR MAGNETIC RESONANCE IMAGING SYSTEM AND MAGNETIC RESONANCE IMAGING SYSTEM

CROSS-REFERENCE TO RELATED APPLICATIONS

This application claims priority pursuant to 35 U.S.C. 119(a) to China Patent Application No. 202010705119.4 filed on Jul. 21, 2020, which application is incorporated herein by reference in its entirety.

TECHNICAL FIELD

The present invention relates to a medical imaging technique, and more specifically, relates to a monitoring method and device for a magnetic resonance imaging system and a magnetic resonance imaging system.

BACKGROUND

Magnetic resonance imaging (MRI), as a medical imaging modality, can acquire images of the human body without using X-rays or other ionizing radiation. MRI uses a magnet having a strong magnetic field to generate a static magnetic field B0. When a portion to be imaged of the human body is positioned in the static magnetic field B0, nuclear spins associated with hydrogen nuclei in the human tissue are polarized, so that the tissue of the portion to be imaged generates a longitudinal magnetization vector at a macroscopic level. After a radio-frequency field B1 intersecting the direction of the static magnetic field B0 is applied, the direction of rotation of protons changes so that the tissue of the portion to be image generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the portion to be imaged can be reconstructed based on the acquired signal. A gradient system is used to transmit a layer selection gradient pulse, a phase-coded gradient pulse, and a frequency-coded gradient pulse (also referred to as a read-out gradient pulse) to provide three-dimensional position information for the aforementioned magnetic resonance signal, thus implementing image reconstruction.

In recent years, more and more people choose to implant medical, orthopedic, plastic surgery, and other devices in the body. Before imaging the human body using magnetic resonance imaging technology, a safety assessment needs to be made for implants in the human body, such as a cardiac pacemaker, an orthopedic implantation instrument, and a puncture instrument, as such implants may cause safety issues during a magnetic resonance imaging process. When used as a transmitting and/or receiving coil, a body coil can transmit or receive a signal to or from the entire body of a subject under examination and has a larger coverage region (or imaging region), such that an implant is inevitably exposed in the imaging region, and a specific absorption rate (SAR) of the subject under examination will be larger, thus endangering the subject under examination.

Generally, a local coil can be used to perform scanning. The body coil and the local coil respectively correspond to two different sets of control circuits (or hardware), that is, components such as a frequency synthesizer and/or a radio frequency amplifier, thereby increasing hardware complexity of a magnetic resonance imaging system. However, a local region specific absorption rate can be estimated on the basis of radio frequency power transmitted to the local coil by a radio frequency amplifier. But, there will still be some problems if control hardware for the local coil is eliminated, and control hardware for the body coil is used to control the local coil to generate a radio frequency field by means of electromagnetic coupling between the body coil and the local coil. For example, the local region specific absorption rate of the subject under examination cannot be monitored or acquired in this process, and it is impossible to know or control the risk faced by the subject under examination.

SUMMARY

The present invention provides a monitoring method and device for a magnetic resonance imaging system, and a magnetic resonance imaging system.

An exemplary embodiment of the present invention provides a monitoring method for a magnetic resonance imaging system. The monitoring method includes: acquiring a whole body specific absorption rate of a subject under examination; acquiring a ratio between a local region specific absorption rate and the whole body specific absorption rate of the subject under examination on the basis of current parameter information of a local coupling coil in a magnetic resonance imaging system; and calculating the local region specific absorption rate on the basis of the ratio and the whole body specific absorption rate.

Specifically, the acquiring a ratio between a local region specific absorption rate and the whole body specific absorption rate of the subject under examination on the basis of current parameter information of a local coupling coil in the magnetic resonance imaging system comprises: acquiring the current parameter information of the local coupling coil; and acquiring, on the basis of predetermined correspondences between parameter information and ratios, the ratio corresponding to the current parameter information of the local coupling coil.

Specifically, the correspondences are predetermined by means of electromagnetic simulation.

Specifically, the parameter information of the local coupling coil comprises the size of the local coupling coil.

Specifically, the parameter information of the local coupling coil comprises position information of the local coupling coil in the magnetic resonance imaging system.

Specifically, the position information of the local coupling coil in the magnetic resonance imaging system is acquired on the basis of the center of a region of interest in a pre-scan image.

Specifically, the position information of the local coupling coil in the magnetic resonance imaging system is acquired on the basis of switch signals triggered when the local coupling coil is installed at different positions on a scanning table.

Specifically, before the acquiring a ratio between a local region specific absorption rate and the whole body specific absorption rate, the method further comprises: determining whether an implant is present in the subject under examination; and if so, prompting a user to install the local coupling coil on the scanning table.

Specifically, before the acquiring a ratio between a local region specific absorption rate and the whole body specific absorption rate, the method further comprises: determining whether the local coupling coil is installed on the scanning table; and if the local coupling coil is installed on a scanning panel, acquiring the ratio between the local region specific absorption rate and the whole body specific absorption rate of the subject under examination.

Specifically, the determining whether the local coupling coil is installed on the scanning table comprises: determining whether the local coupling coil is installed on the basis of the magnitude of radio frequency power required to complete a scan.

Specifically, the determining whether the local coupling coil is installed on the scanning table comprises: determining whether the local coupling coil is installed on the basis of a switch signal triggered in response to installation of the local coupling coil on the scanning table.

Specifically, the monitoring method further comprises: displaying the local region specific absorption rate and the whole body specific absorption rate.

An exemplary embodiment of the present invention further provides a non-transitory computer-readable storage medium for storing a computer program, wherein the computer program, when executed by a computer, allows the computer to implement the foregoing monitoring method.

An exemplary embodiment of the present invention further provides a monitoring device for a magnetic resonance imaging system. The monitoring device comprises an acquisition module and a calculation module. The acquisition module is configured to acquire a whole body specific absorption rate of a subject under examination, and to acquire a ratio between a local region specific absorption rate and the whole body specific absorption rate of the subject under examination on the basis of current parameter information of a local coupling coil in a magnetic resonance imaging system. The calculation module is configured to calculate the local region specific absorption rate on the basis of the ratio and the whole body specific absorption rate.

Specifically, the acquisition module is further configured to acquire the current parameter information of the local coupling coil, and to acquire, on the basis of predetermined correspondences between parameter information and ratios, the ratio corresponding to the current parameter information of the local coupling coil.

Specifically, the parameter information of the local coupling coil comprises the size of the local coupling coil.

Specifically, the parameter information of the local coupling coil comprises position information of the local coupling coil in the magnetic resonance imaging system.

Specifically, the monitoring device further comprises a first determination module configured to determine whether an implant is present in the subject under examination, and to prompt a user to install the local coupling coil on a scanning table if the implant is present in the subject under examination.

Specifically, the monitoring device further comprises a second determination module configured to determine whether the local coupling coil is installed on the scanning table, and to acquire the ratio between the local region specific absorption rate and the whole body specific absorption rate of the subject under examination if the local coupling coil is installed on a scanning panel.

Specifically, the monitoring device further comprises a display module configured to display the local region specific absorption rate and the whole body specific absorption rate.

An exemplary embodiment of the present invention further provides a magnetic resonance imaging system. The system comprises a local coupling coil and the monitoring device as described above.

Specifically, the local coupling coil is configured to concentrate a radio frequency field generated by a body coil in a local region in an imaging space.

Other features and aspects will become clear through the following detailed description, accompanying drawings, and claims.

BRIEF DESCRIPTION OF THE DRAWINGS

The present invention may be better understood by describing exemplary embodiments of the present invention with reference to accompanying drawings, in which.

DETAILED DESCRIPTION OF THE EMBODIMENTS

Specific implementations of the present invention will be described in the following. It should be noted that during the specific description of the implementations, it is impossible to describe all features of the actual implementations in detail in this description for the sake of brief description. It should be understood that in the actual implementation of any of the implementations, as in the process of any engineering project or design project, a variety of specific decisions are often made in order to achieve the developer's specific objectives and meet system-related or business-related restrictions, which will vary from one implementation to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. The terms "first," "second," and similar terms used in the description and claims of the patent application of the present invention do not denote any order, quantity, or importance, but are merely intended to distinguish between different constituents. "One," "a(n)," and similar terms are not meant to be limiting, but rather denote the presence of at least one. The term "include," "comprise," or a similar term is intended to mean that an element or article that appears before "include" or "comprise" encompasses an element or article and equivalent elements that are listed after "include" or "comprise," and does not exclude other elements or articles. The term "connect," "connected," or a similar term is not limited to a physical or mechanical connection, and is not limited to a direct or indirect connection.

Figure 1:
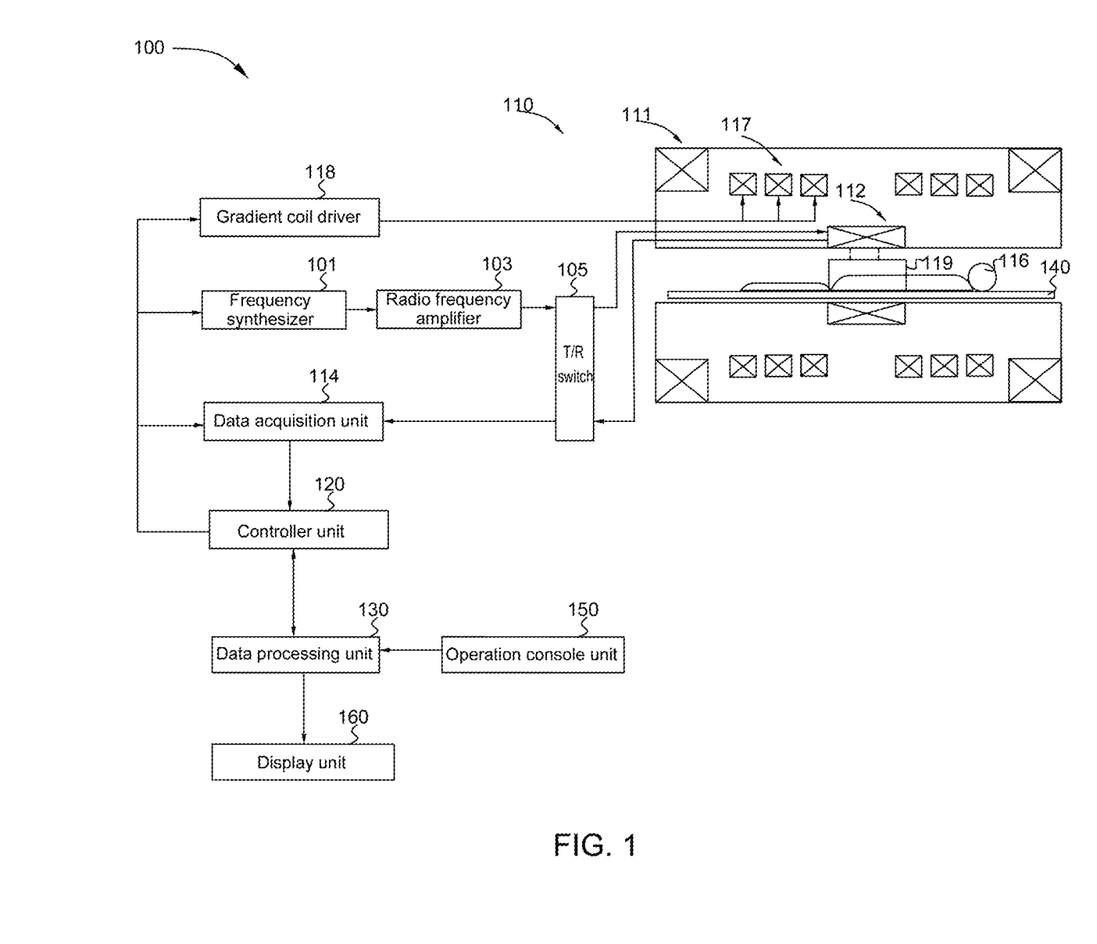
FIG. 1 is a schematic diagram of a magnetic resonance imaging system according to some embodiments of the present invention.

FIG. 1 shows a schematic diagram of an MRI system 100 according to some embodiments of the present invention. As shown in FIG. 1, the MRI system 100 includes a scanner 110, a controller unit 120, and a data processing unit 130. The MRI system 100 is described only as an example. In some other embodiments, the MRI system 100 may have various variations, as long as image data can be acquired from a subject under examination.

The scanner 110 can be used to acquire data of a subject under examination 116. The controller unit 120 is coupled to the scanner 110 to control operation of the scanner 110. The scanner 110 may include a main magnet 111, a radio frequency transmit coil 112, a frequency synthesizer 101, a radio frequency amplifier 103, a transmit/receive switch (T/R switch) 105, a gradient coil system 117, a gradient coil driver 118, and a radio frequency receive coil 119.

The main magnet 111 generally includes, for example, an annular superconducting magnet. The annular superconducting magnet is mounted in an annular vacuum container. The annular superconducting magnet defines a cylindrical space surrounding the subject under examination 116. Moreover, a constant static magnetic field, such as a static magnetic field B0, is generated along a Z direction of the cylindrical space. The MRI system 100 uses the formed static magnetic field B0 to emit a magnetostatic pulse signal to the subject under examination 116 placed in an imaging space, so that the precession of protons in the body of the subject under examination 116 is ordered to generate a longitudinal magnetization vector.

The frequency synthesizer 101 is configured to generate a radio frequency pulse. The radio frequency pulse may include a radio frequency excitation pulse. The radio frequency excitation pulse is amplified by the radio frequency amplifier 103 and is then applied to the radio frequency transmit coil 112 by the T/R switch 105, so that the radio frequency transmit coil 112 emits to the subject under examination 116 a radio frequency magnetic field B1 orthogonal to the static magnetic field B0 so as to excite nuclei in the body of the subject under examination 116, and the longitudinal magnetization vector is converted into a transverse magnetization vector. After the end of the radio frequency excitation pulse, a free induction decay signal, i.e., a magnetic resonance signal that can be acquired, is generated in the process in which the transverse magnetization vector of the subject under examination 116 gradually returns to zero.

Specifically, in the magnetic resonance imaging system, a body coil may be used as a transmitting coil or a receiving coil, that is, a radio frequency field can be transmitted by means of the body coil, and a magnetic resonance signal can be received by means of the body coil (a first mode). Certainly, a local coil may also be used as a transmitting coil or a receiving coil, that is, a radio frequency field is transmitted by means of the local coil, and a magnetic resonance signal is received by means of the local coil (a second mode). Additionally, the most commonly used mode consists of transmitting a radio frequency field by means of the body coil and receiving a magnetic resonance signal by means of the local coil (a third mode). In the second and third modes, additional control hardware needs to be provided to control the local coil, while the quality of an image obtained in the first mode is poor.

Therefore, based on electromagnetic coupling between the body coil and the local coil, the local coil can transmit a radio frequency field and acquire a magnetic resonance signal by means of only the control hardware for the body coil. In some embodiments, the local coil includes a head coil, a joint coil, and the like.

The gradient coil system 117 forms a magnetic field gradient in the imaging space so as to provide three-dimensional position information for the magnetic resonance signal described above. The magnetic resonance signal may be received by the radio frequency receive coil 119, or by the body coil or the local coil in the receive mode. The data processing unit 130 may process the received magnetic resonance signal so as to acquire required images or image data.

Specifically, the gradient coil system 117 may include three gradient coils. Each of the three gradient coils generates a gradient magnetic field inclined to one of three spatial axes (for example, X-axis, Y-axis, and Z-axis) perpendicular to one another, and generates a gradient field according to imaging conditions in each of a slice selection direction, a phase-encoding direction, and a frequency-encoding direction. More specifically, the gradient coil system 117 applies a gradient field in the slice selection direction of the subject under examination 116 so as to select a slice. The radio frequency transmit coil 112 emits a radio frequency excitation pulse to the slice selected for the subject under examination 116 and excites the slice. The gradient coil system 117 also applies a gradient field in the phase-encoding direction of the subject under examination 116 so as to perform phase encoding on a magnetic resonance signal of the excited slice. The gradient coil system 117 then applies a gradient field in the frequency-encoding direction of the subject under examination 116 so as to perform frequency encoding on the magnetic resonance signal of the excited slice.

The gradient coil driver 118 is configured to respectively provide a suitable power signal for the aforementioned three gradient coils in response to a sequence control signal transmitted by the controller unit 120.

The scanner 110 may further include a data acquisition unit 114. The data acquisition unit 114 is configured to acquire a magnetic resonance signal received by a radio frequency surface coil 119 or the body coil. The data acquisition unit 114 may include, for example, a radio frequency preamplifier (not shown), a phase detector (not shown), and an analog-to-digital converter (not shown), wherein the radio frequency preamplifier is configured to amplify a magnetic resonance signal received by the radio frequency surface coil 119 or the body coil. The phase detector is configured to perform phase detection on the amplified magnetic resonance signal. The analog-to-digital converter is configured to convert the magnetic resonance signal on which the phase detection has been performed from an analog signal to a digital signal. The data processing unit 130 can perform processing such as calculation and reconstruction on the digitized magnetic resonance signal so as to acquire a medical image.

The data processing unit 130 may include a computer and a storage medium. A program of predetermined data processing to be executed by the computer is recorded on the storage medium. The data processing unit 130 may be connected to the controller unit 120 and perform data processing based on a control signal received from the controller unit 120. The data processing unit 130 may also be connected to the data acquisition unit 114 to receive a magnetic resonance signal output by the data acquisition unit 114, so as to perform the aforementioned data processing.

The controller unit 120 may include a computer and a storage medium. The storage medium is used to store a program executable by the computer, and when the computer executes the program, a plurality of components of the scanner 110 are enabled to implement operations corresponding to the aforementioned imaging sequence. The data processing unit 130 may also be caused to perform predetermined data processing.

The storage medium of the controller unit 120 and the data processing unit 130 may include, for example, a ROM, a floppy disk, a hard disk, an optical disk, a magneto-optical disk, a CD-ROM, or a non-volatile memory card.

The controller unit 120 may be set and/or arranged for use in different manners. For example, in some implementations, a single controller unit 120 may be used. In other implementations, a plurality of controller units 120 are configured to work together (for example, based on distributed processing configuration) or separately, in which each controller unit 120 is configured to handle specific aspects and/or functions, and/or to process data used to generate a model used only for a specific medical imaging system 100. In some implementations, the controller unit 120 may be local (for example, in the same place as one or a plurality of medical imaging systems 100, for example, in the same facility and/or the same local network). In other implementations, the controller unit 120 may be remote and thus can only be accessed via a remote connection (for example, via the Internet or other available remote access technologies). In a specific implementation, the controller unit 120 may be configured in a manner similar to that of cloud technology, and may be accessed and/or used in a manner substantially similar to that of accessing and using other cloud-based systems.

The MRI system 100 further includes an examination table 140 on which the subject under examination 116 is placed. the subject under examination 116 may be moved into or out of the imaging space by moving the examination table 140 based on the control signal from the controller unit 120.

The MRI system 100 further includes an operation console unit 150 connected to the controller unit 120. The operation console unit 150 may send an acquired operation signal to the controller unit 120 so as to control operation states of the aforementioned components, for example, the examination table 140 and the scanner 110. The operation signal may include, for example, a scanning protocol and a parameter selected manually or automatically. The scanning protocol may include the aforementioned imaging sequence. In addition, the operation console unit 150 may transmit the acquired operation signal to the controller unit 120 to control the data processing unit 130, so as to acquire a desired image.

The operation console unit 150 may include a user input device such as a keyboard, a mouse, a voice activated controller, or any other suitable input devices, by which an operator may input an operation signal/control signal to the controller unit 120.

The MRI system 100 may further include a display unit 160 that may be connected to the operation console unit 150 to display an operation interface and may further be connected to the data processing unit 130 to display the image.

In some embodiments, the system 100 may be connected, via one or more configurable wired and/or wireless networks such as the Internet and/or a virtual private network, to one or more display units, cloud networks, printers, workstations, and/or similar apparatuses located locally or remotely.

Figure 2:
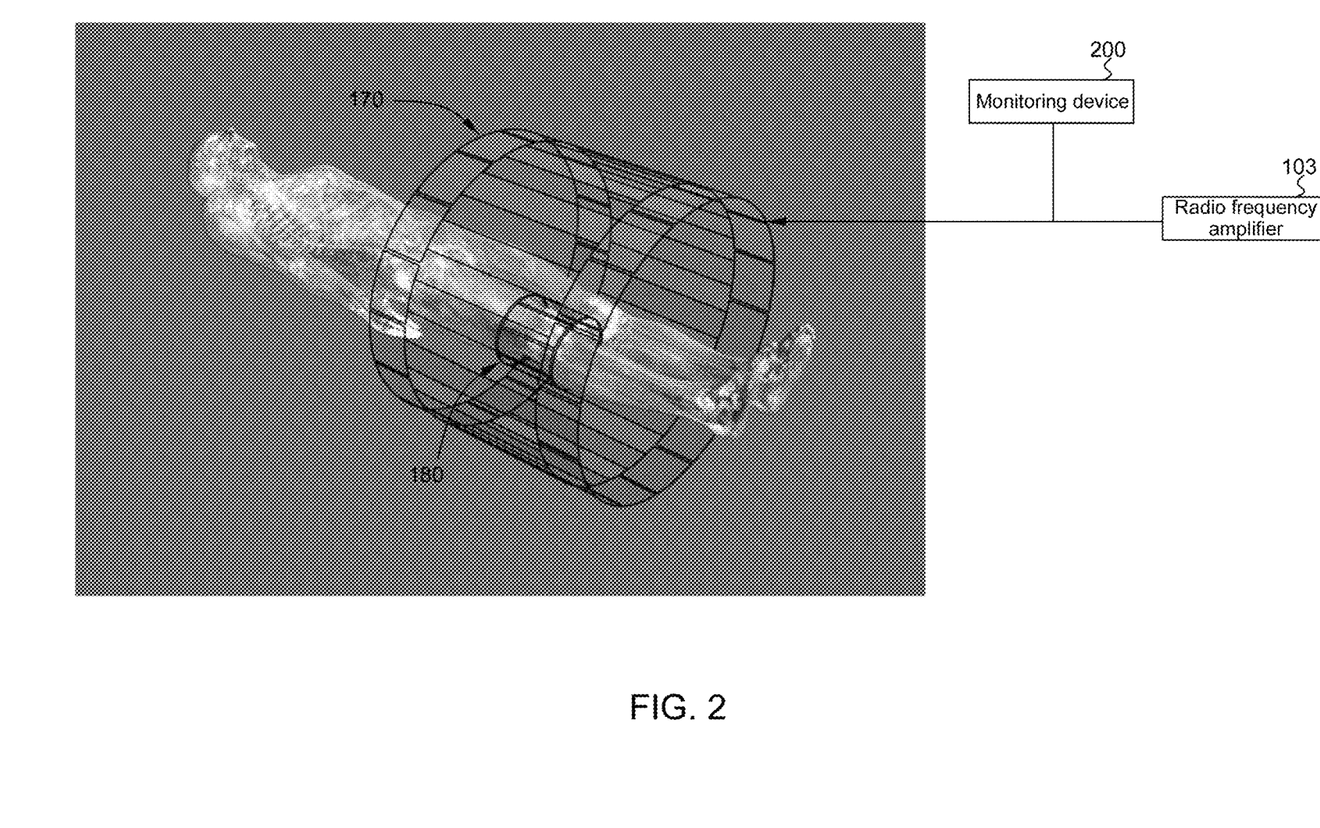
FIG. 2 is a partial schematic diagram of the magnetic resonance imaging system shown in FIG. 1.

FIG. 2 shows a partial schematic diagram of the magnetic resonance imaging system shown in FIG. 1. As shown in FIG. 2, the magnetic resonance imaging system includes a body coil 170 and a local coupling coil 180, wherein the local coupling coil 180 is configured to concentrate a radio frequency field generated by the body coil 170 in a local region in an imaging space.

The local coupling coil 180 may be installed on a scanning panel, and coupled with the body coil 170. Specifically, the radio frequency amplifier 103 can amplify a radio frequency excitation pulse (i.e., radio frequency power) and apply the amplified radio frequency excitation pulse to the body coil 170. The body coil 170 can generate a radio frequency field. The local coupling coil 180 can concentrate, based on an electromagnetic coupling effect, the radio frequency field generated by the body coil 170 in an internal imaging region of the local coupling coil 180, thereby realizing normal functions of the local coil without needing to add or provide a hardware circuit for controlling the local coil. The hardware circuit may be control hardware such as a radio frequency amplifier.

In some embodiments, the local coupling coil 180 is a birdcage coil, and more specifically, the local coupling coil 180 is an unplugged birdcage coil. Preferably, the local coupling coil is a birdcage coil having no circuit interface. In some special embodiments, a circuit interface is reserved or provided on the local coupling coil, and the magnetic resonance imaging system can determine, by means of the circuit interface, whether the local coupling coil is installed on a scanning panel. However, provision of the circuit interface is not necessarily required. If no circuit interface is present on the local coupling coil, whether the local coupling coil is installed on the scanning panel may be determined by other means.

In some embodiments, the magnetic resonance imaging system includes a monitoring device 200. Generally, the monitoring device 200 can acquire the radio frequency power provided to the body coil 170 by the radio frequency amplifier 103 to estimate a specific absorption rate (SAR) generated when a subject under examination is scanned. The specific absorption rate in this case is a whole body specific absorption rate of the subject under examination. The term "specific absorption rate" refers to power or energy absorbed per unit by the human body, in units of W/kg. The SAR is a safety-related parameter commonly used in magnetic resonance imaging procedures.

If the body coil 170 is selected to serve as a radio frequency transmitting and/or receiving coil, the monitoring device 200 can acquire the radio frequency power, and the whole body specific absorption rate can be acquired by dividing the radio frequency power by the weight of the subject under examination. However, when the local coupling coil 180 is installed on the scanning panel and the radio frequency field is concentrated, the monitoring device 200 cannot acquire a corresponding local region specific absorption rate generated when the local coupling coil is used to perform scanning. The whole body specific absorption rate (whole body SAR) refers to power and energy absorbed per unit weight by the subject under examination, and the local region specific absorption rate refers to power and energy absorbed per unit by a body part exposed to the local coupling coil. The local region specific absorption rate includes a partial body specific absorption rate (partial body SAR), a head specific absorption rate (head SAR), and a local specific absorption rate (local SAR), in which the head SAR is a special case of the partial body SAR, and the local SAR refers to a specific absorption rate corresponding to a mass of 10 g.

Figure 3:
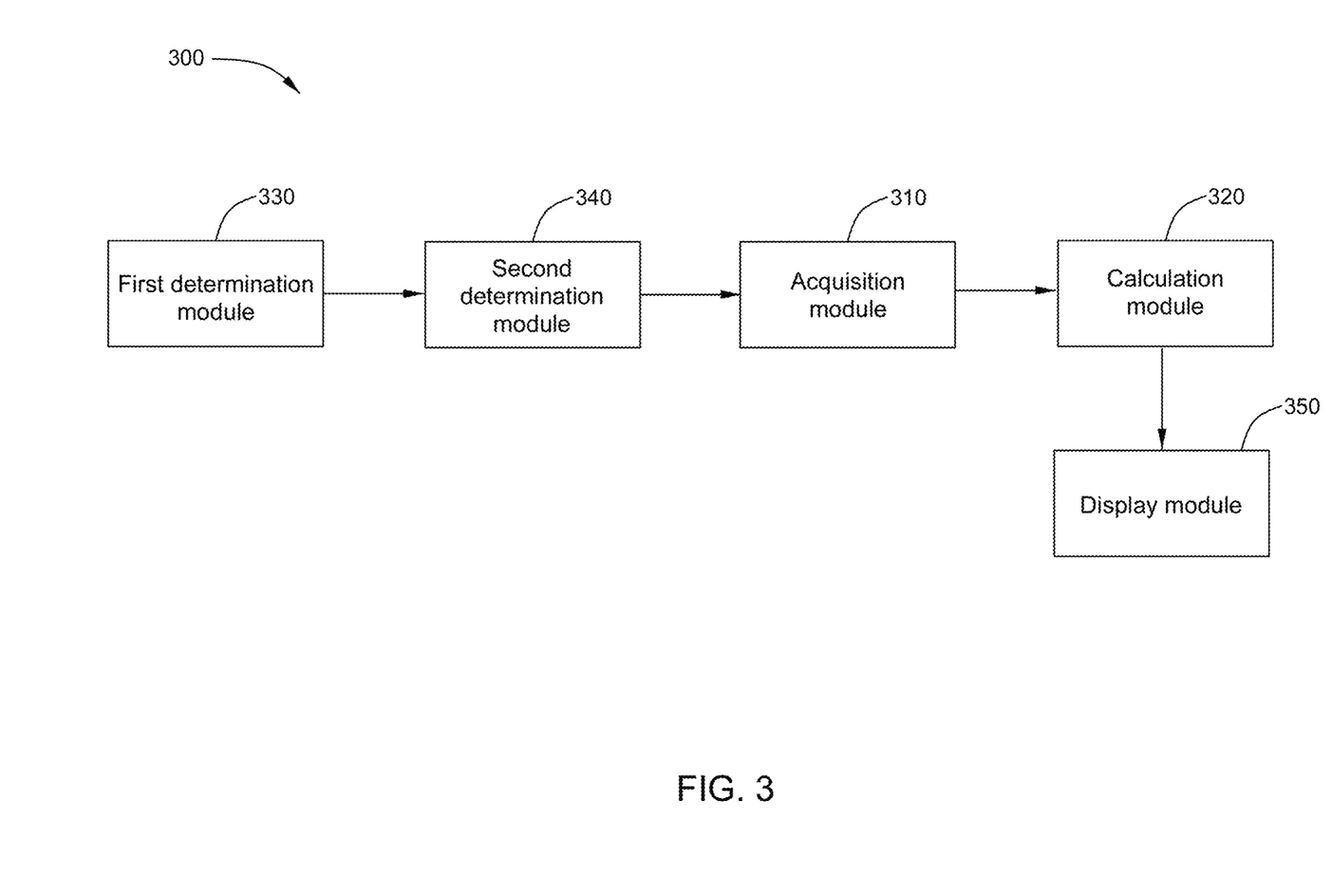
FIG. 3 is a schematic diagram of a monitoring device according to some embodiments of the present invention.

Therefore, the present invention proposes a monitoring device 300, which can acquire a proportional relationship between a local region specific absorption rate and a whole body specific absorption rate by using parameter information of the local coupling coil, and calculate the local region specific absorption rate on the basis of the whole body specific absorption rate.

FIG. 3 shows a schematic diagram of a monitoring device 300 according to some embodiments of the present invention. As shown in FIG. 3, the monitoring device 300 includes an acquisition module 310 and a calculation module 320. The acquisition module 310 can acquire a whole body specific absorption rate of a subject under examination, and acquire a ratio r between a local region specific absorption rate and the whole body specific absorption rate of the subject under examination on the basis of parameter information of a local coupling coil in a magnetic resonance imaging system. The calculation module 320 can calculate the local region specific absorption rate on the basis of the ratio r between the local region specific absorption rate and the whole body specific absorption rate, and the whole body specific absorption rate.

The ratio may refer to a quotient acquired by dividing the local region specific absorption rate by the whole body specific absorption rate, or may refer to a quotient acquired by dividing the whole body specific absorption rate by the local region specific absorption rate, or may be a quotient acquired by performing operations on the local region specific absorption rate or the whole body specific absorption rate that has undergone adaptive transformation.

Specifically, the local coupling coil is configured to concentrate a radio frequency field generated by a body coil in a local region in an imaging space.

Specifically, the parameter information of the local coupling coil includes the size of the local coupling coil. Specifically, by determining the size of the local coupling coil, a proportion between the local coupling coil and the body coil, i.e., a ratio between an imaging region of the local coupling coil and an imaging region of the body coil, can be determined.

Specifically, the parameter information of the local coupling coil includes position information of the local coupling coil in the magnetic resonance imaging system. Specifically, the position information of the local coupling coil in the magnetic resonance imaging system may be the position of the local coupling coil relative to the body coil or relative to a scanning panel.

In some embodiments, the acquisition module 310 may acquire the ratio r between the local region specific absorption rate and the whole body specific absorption rate of the subject under examination according to only the size of the local coupling coil. Specifically, when the size of the local coupling coil is one third of the body coil, it can be roughly estimated that the ratio r between the local region specific absorption rate and the whole body specific absorption rate is also one third. The ratio of the local region SAR to the whole body SAR can be conveniently determined according to only the size of the local coupling coil, so as to acquire the local region SAR.

In some embodiments, more precisely, the acquisition module 310 can acquire the ratio r between the local region specific absorption rate and the whole body specific absorption rate of the subject under examination according to the size of the local coupling coil and the position information of the local coupling coil.

Specifically, the acquisition module 310 may be further configured to acquire the current parameter information of the local coupling coil, and to acquire, on the basis of predetermined correspondences between parameter information and ratios, the ratio corresponding to the current parameter information of the local coupling coil. In some embodiments, the correspondences are predetermined by means of electromagnetic simulation.

Specifically, in the electromagnetic simulation, an electric field or magnetic field distribution in the local coupling coil can be acquired by arranging the body coil, the local coupling coil and a human body model, and by changing the position of the local coupling coil relative to the body coil on the basis of internal geometric structures of the body coil and the local coupling coil. A correspondence between the ratio and the position of the local coupling coil is acquired on the basis of an electromagnetic constant (for example, variable conductivity) in the human body model. Local coupling coils of different sizes are provided so as to determine correspondences between ratios and positions for the local coupling coils of different sizes. The correspondences can be stored in the magnetic resonance imaging system, for example, stored in the magnetic resonance imaging system in the form of a look-up table (LUT). In an actual scanning process, a corresponding ratio can be acquired on the basis of the acquired parameter information of the local coupling coil. Certainly, in the electromagnetic simulation process, a maximum value of correspondences between the ratios and the sizes and positions of the local coupling coils can be acquired, and this maximum value can be used to perform monitoring in the actual scanning process, enabling convenient and safe monitoring of the local region SAR.

In the electromagnetic simulation, different correspondences may also be acquired according to weights that the two parameters (the size and position information) account for. For example, the position of the local coupling coil may be selected as a dominant factor, and the ratio r may mainly correlate to the position of the local coupling coil. When the local coupling coil is located at the center of the body coil, the ratio r is higher; when part of the local coupling coil exceeds the imaging region of the body coil, the ratio r is lower. The size of the local coupling coil has less influence on the ratio r. Certainly, the selection of the weights may be determined by a user, or may be determined on the basis of the size, material, type, and other information of an implant.

In some embodiments, the position information of the local coupling coil in the magnetic resonance imaging system may be acquired on the basis of switch signals triggered when the local coupling coil is installed at different positions on a scanning table. A plurality of switches may be arranged at different positions of a scanning panel. When the local coupling coil is installed on the scanning table, a certain switch will be triggered to generate a trigger signal, and the system will acquire position information corresponding to the switch, i.e., a current position of the local coupling coil.

In some other embodiments, the position information of the local coupling coil in the magnetic resonance imaging system may also be acquired on the basis of the center of a region of interest in a pre-scan image. The pre-scan image is an initial image acquired in a pre-scan process. The pre-scan process usually refers to a scan process performed to determine a scan sequence before a formal imaging scan. The pre-scan process usually involves acquiring an initial image corresponding to a larger region of the subject under examination. The user can determine a part or region that needs to undergo an imaging scan, i.e., the region of interest (ROI), according to the initial image, and the center of the region of interest may be roughly determined to be the center of the local coupling coil, thereby determining the position of the local coupling coil.

In still other embodiments, the position information of the local coupling coil relative to the body coil may also be manually input by the user. Some examples of actual scanning tables may include a scale, and the scale number corresponding to a currently installed local coupling coil can be read to determine the position of the current local coupling coil, and the position is then input into the system via an operation console unit (the component 150 as shown in FIG. 1), thus acquiring the position information of the local coupling coil.

Although the present invention recites three kinds of embodiments for acquiring the position information of the local coupling coil relative to the body coil, those skilled in the art should understand that other appropriate methods can also be used to determine the position of the local coupling coil without being limited to the three methods described above.

The calculation module 320 can calculate the local region specific absorption rate on the basis of the ratio r between the local region specific absorption rate and the whole body specific absorption rate and the whole body specific absorption rate. Specifically, the local region specific absorption rate is equal to the product of the whole body specific absorption rate and the ratio r between the local region specific absorption rate and the whole body specific absorption rate.

In some embodiments, the monitoring device 300 further includes a first determination module 330 configured to determine whether an implant is present in the subject under examination, and to prompt a user to install the local coupling coil on the scanning table if the implant is present in the subject under examination.

If no implant is present in the subject under examination, a conventional procedure or scan sequence is used to perform scanning so as to estimate and monitor the whole body specific absorption rate of the subject under examination.

Specifically, the first determination module 330 may determine whether the subject under examination has an implant according to a difference between images or one-dimensional signals acquired by executing two scan sequences having different frequency encoding directions, or may determine whether the subject under examination has an implant according to a difference between two sets of images acquired by changing an echo time. Those skilled in the art should understand that other appropriate methods may also be used to determine whether an implant is present in the subject under examination, including, but not limited to, oral inquiries or case information enquiry.

In some embodiments, the monitoring device 300 further includes a second determination module 340 configured to determine whether the local coupling coil is installed on a scanning table, and to acquire the ratio between the local region specific absorption rate and the whole body specific absorption rate of the subject under examination if the local coupling coil is installed on a scanning panel.

In some embodiments, the second determination module 340 may determine, on the basis of the magnitude of radio frequency power (transmit power) required to complete the scan, whether the local coupling coil is installed. Generally, the body coil and the local coil require significantly different radio frequency powers, which may differ by a multiple. For example, the body coil may require radio frequency power of several thousands of watts, while the local coil may require radio frequency power of only a few hundreds of watts. Therefore, whether the local coupling coil is installed or provided on the scanning panel can be determined by determining the magnitude of the radio frequency power.

In some other embodiments, the second determination module 340 may also determine, on the basis of a switch signal triggered when the local coupling coil is installed on the scanning table, whether the local coupling coil is installed. Specifically, similar to the determination of the position information of the local coupling coil, whether the local coupling coil is installed may be determined according to a switch signal triggered in response to installation of the local coupling coil on the scanning panel.

In still other embodiments, the second determination module 340 may also determine, on the basis of the local coupling coil and a circuit interface, whether the local coupling coil is installed. Specifically, the local coupling coil of the present invention is an unplugged birdcage coil. However, in some scenarios, at least one circuit interface may be reserved in the local coupling coil. When the local coupling coil is installed on the scanning panel, the magnetic resonance imaging system will determine, through the circuit interface, that the local coupling coil has been installed. However, those skilled in the art should understand that this embodiment does not impose the limitation that a circuit interface is required for the local coupling coil. When there is no circuit interface, other methods may also be used to determine the position of the local coupling coil.

Although the present invention recites three kinds of embodiments for determining whether the local coupling coil is installed or provided on the scanning panel, those skilled in the art should understand that other appropriate methods, such as manual input by a user, may also be used for determination.

In some embodiments, the monitoring device 300 further includes a display module 350 configured to display the local region specific absorption rate and the whole body specific absorption rate. Specifically, the display module 350 may also be a display unit as shown in FIG. 1.

Figure 4:
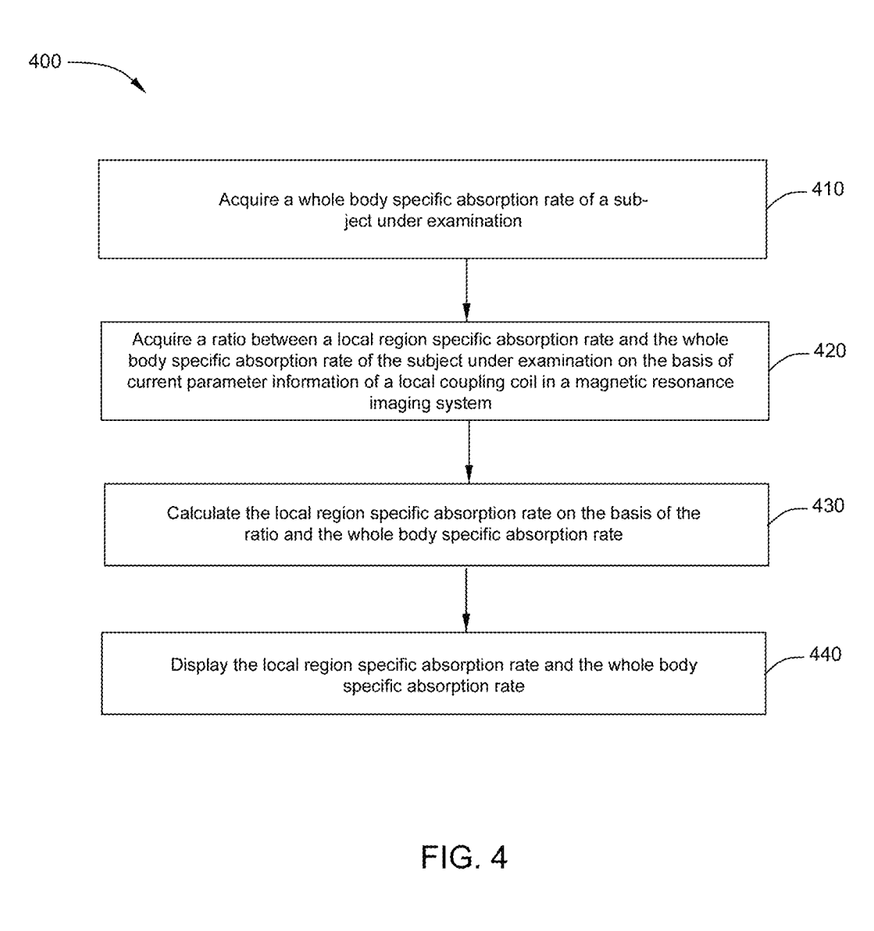
FIG. 4 is a flowchart of a monitoring method according to some embodiments of the present invention.

FIG. 4 shows a flowchart of a monitoring method 400 for a magnetic resonance imaging system according to some embodiments of the present invention. As shown in FIG. 4, the monitoring method 400 for a magnetic resonance imaging system according to some embodiments of the present invention includes step 410, step 420, and step 430.

In step 410, a whole body specific absorption rate of a subject under examination is acquired. Specifically, the whole body specific absorption rate is estimated and acquired on the basis of radio frequency power provided to a body coil by a radio frequency amplifier.

In step 420, a ratio between a local region specific absorption rate and the whole body specific absorption rate of the subject under examination is acquired on the basis of parameter information of a local coupling coil in a magnetic resonance imaging system.

Specifically, the local coupling coil is configured to concentrate a radio frequency field generated by the body coil in a local region in an imaging space. By arranging a non-energized birdcage local coil and providing radio frequency power through a control circuit for the body coil, the radio frequency field of the body coil is concentrated in an imaging region of the local coil on the basis of an electromagnetic coupling effect. The above arrangement can reduce the hardware requirement of a control circuit for the local coil in the magnetic resonance imaging system, reduce system complexity, implement functions of the local coil, and reduce the local region specific absorption rate of the subject under examination.

In some embodiments, the parameter information of the local coupling coil includes the size of the local coupling coil. In some embodiments, the parameter information of the local coupling coil further includes position information of the local coupling coil in the magnetic resonance imaging system.

In some embodiments, the position information of the local coupling coil relative to the body coil is acquired on the basis of the center of a region of interest in a pre-scan image. In some other embodiments, the position information of the local coupling coil relative to the body coil is acquired on the basis of switch signals triggered when the local coupling coil is installed at different positions on a scanning table.

In some embodiments, the ratio between the local region specific absorption rate and the whole body specific absorption rate may only correlate to the size of the local coupling coil. By acquiring a ratio between the sizes of the local coupling coil and the body coil, the ratio between the local region specific absorption rate and the whole body specific absorption rate can be roughly estimated.

In some other embodiments, the ratio between the local region specific absorption rate and the whole body specific absorption rate may only correlate to the position information of the local coupling coil relative to the body coil. By determining the position of the local coupling coil relative to the body coil, the ratio between the local region specific absorption rate and the whole body specific absorption rate can be roughly estimated. In still other embodiments, the ratio between the local region specific absorption rate and the whole body specific absorption rate may correlate to the size of the local coupling coil and the position information of the local coupling coil relative to the body coil.

Specifically, the step of acquiring a ratio between a local region specific absorption rate and the whole body specific absorption rate of the subject under examination on the basis of current parameter information of a local coupling coil in the magnetic resonance imaging system includes: acquiring the current parameter information of the local coupling coil; and acquiring, on the basis of predetermined correspondences between parameter information and ratios, the ratio corresponding to the current parameter information of the local coupling coil. The correspondences are predetermined by means of electromagnetic simulation.

In some embodiments, in the electromagnetic simulation process, correspondences between the ratio of the local region specific absorption rate to the whole body specific absorption rate, the size of the local coupling coil, and the position information of the local coupling coil relative to the body coil may be acquired on the basis of the body coil, the local coupling coil, and the human body model. The correspondences may be stored in the magnetic resonance imaging system, for example, in the form of a look-up table. During an actual scanning process, the ratio corresponding to the parameter information can be acquired on the basis of current parameter information of the local coupling coil acquired in the actual scanning process.

In step 430, the local region specific absorption rate is calculated on the basis of the ratio between the local region specific absorption rate and the whole body specific absorption rate and the whole body specific absorption rate.

In some embodiments, the local region specific absorption rate is equal to the product of the whole body specific absorption rate and the ratio between the local region specific absorption rate and the whole body specific absorption rate.

In some embodiments, the monitoring method 400 further includes step 440.

In step 440, the local region specific absorption rate and the whole body specific absorption rate are displayed.

Figure 5:
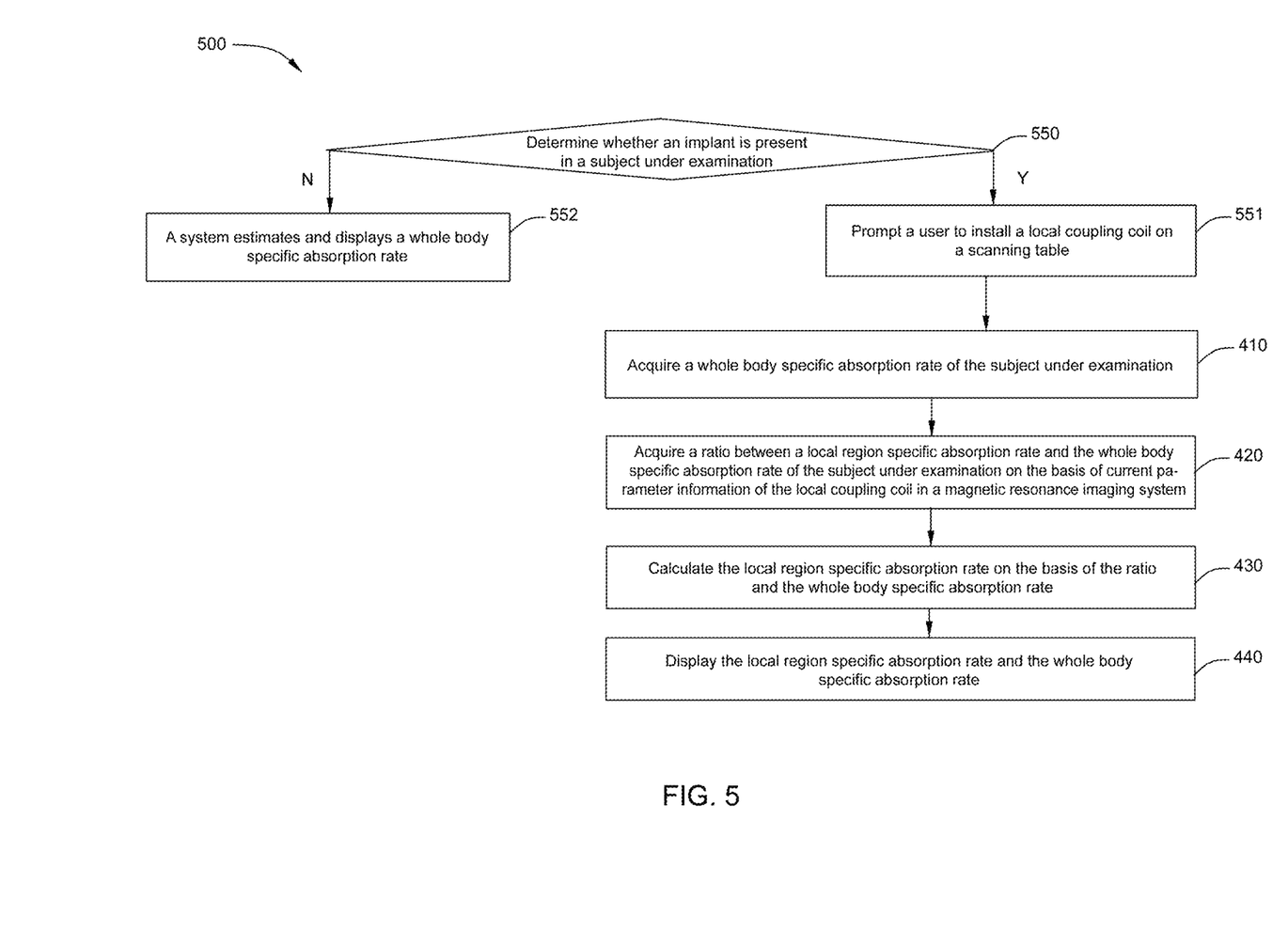
FIG. 5 is a flowchart of a monitoring method according to some other embodiments of the present invention.

FIG. 5 shows a flowchart of a monitoring method 500 for a magnetic resonance imaging system according to some other embodiments of the present invention. As shown in FIG. 5, the monitoring method 500 for a magnetic resonance imaging system according to some embodiments of the present invention differs from the monitoring method 400 shown in FIG. 4 in that the monitoring method 500 further includes step 550.

In step 550, whether an implant is present in a subject under examination is determined. If it is determined that the implant is present in the subject under examination, the method proceeds to step 551, and if it is determined that no implant is present in the subject under examination, the method proceeds to step 552.

In step 551, when the implant is present in the subject under examination, a user is prompted to install a local coupling coil on a scanning table. Then, the method proceeds to step 410.

In step 552, the system estimates and displays a whole body specific absorption rate. Specifically, the whole body specific absorption rate is estimated and acquired on the basis of radio frequency power provided to a body coil by a radio frequency amplifier.

Figure 6:
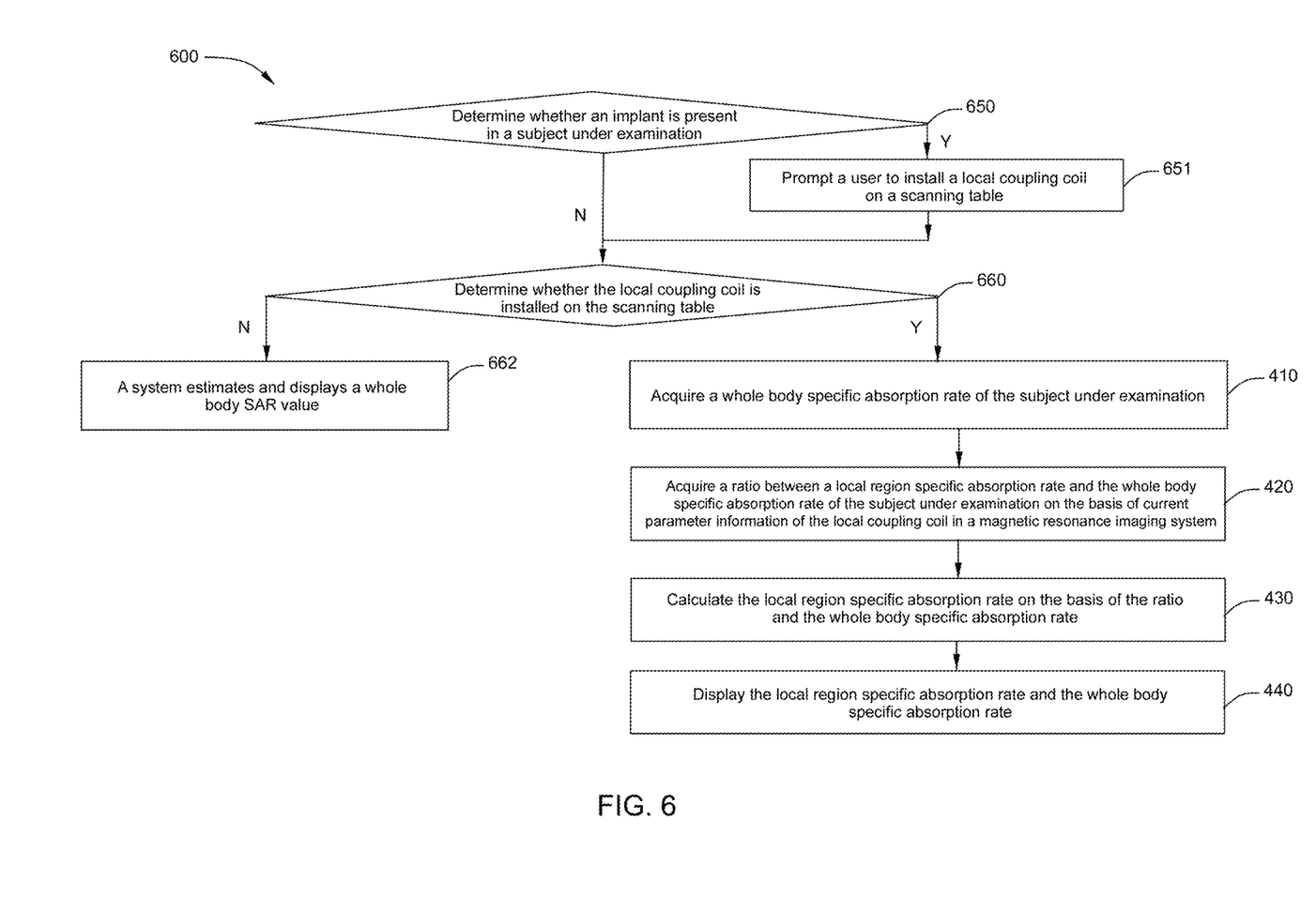
FIG. 6 is a flowchart of a monitoring method according to still other embodiments of the present invention.

FIG. 6 shows a flowchart of a monitoring method 600 for a magnetic resonance imaging system according to some other embodiments of the present invention. As shown in FIG. 6, the monitoring method 600 for a magnetic resonance imaging system according to some embodiments of the present invention differs from the monitoring method 400 shown in FIG. 4 in that the monitoring method 600 further includes step 650 and step 660.

In step 650, whether an implant is present in a subject under examination is determined. If it is determined that the implant is present in the subject under examination, the method proceeds to step 651, and if it is determined that no implant is present in the subject under examination, the method proceeds to step 660.

In step 651, when the implant is present in the subject under examination, a user is prompted to install a local coupling coil on a scanning table. Then, the method proceeds to step 660.

In step 660, whether the local coupling coil is installed on the scanning table is determined. If the local coupling coil is installed on the scanning table, the method proceeds to step 410, and if the local coupling coil is not installed on the scanning table, the method proceeds to step 662.

In some embodiments, whether the local coupling coil is installed on a scanning panel may be determined on the basis of the magnitude of radio frequency power required to complete a scan. In some other embodiments, whether the local coupling coil is installed is also determined on the basis of a switch signal triggered in response to installation of the local coupling coil on the scanning table.

In step 662, the system estimates and displays a whole body specific absorption rate. Specifically, the whole body specific absorption rate is estimated and acquired on the basis of radio frequency power provided to a body coil by a radio frequency amplifier.

In summary, in the monitoring method for a magnetic resonance imaging system in some embodiments of the present invention, a body coil is controlled by a control circuit therefor to generate a radio frequency field, and the radio frequency field is concentrated in a local imaging region by means of a non-energized local coupling coil. Such arrangement can not only reduce system complexity in terms of hardware, but also reduce a specific absorption rate when the system performs scanning, especially for a subject under examination with an implant in the body. Moreover, a ratio between a local region specific absorption rate and a whole body specific absorption rate is estimated by using parameter information of the local coupling coil, including position information and size information, and the local region specific absorption rate can be calculated on the basis of the whole body specific absorption rate estimated by the system, so that the local region specific absorption rate can be conveniently and quickly acquired when the local coil is not provided with control hardware.

The present invention may further provide a non-transitory computer-readable storage medium for storing an instruction set and/or a computer program. When executed by a computer, the instruction set and/or computer program allows the computer to implement the aforementioned method for acquiring a predicted image of a truncated portion. The computer executing the instruction set and/or computer program may be a computer of an MRI system, or may be other devices/modules of the MRI system. In one embodiment, the instruction set and/or computer program may be programmed in a processor/controller of the computer.

Specifically, when executed by the computer, the instruction set and/or computer program allows the computer to:

acquire a whole body specific absorption rate of a subject under examination;

acquire a ratio between a local region specific absorption rate and the whole body specific absorption rate of the subject under examination on the basis of parameter information of a local coupling coil in a magnetic resonance imaging system; and calculate the local region specific absorption rate on the basis of the ratio and the whole body specific absorption rate.

The instructions described above may be combined into one instruction for execution, and any of the instructions may also be split into a plurality of instructions for execution. Moreover, the present invention is not limited to the instruction execution order described above.

As used herein, the term "computer" may include any processor-based or microprocessor-based system including a system that uses a microcontroller, a reduced instruction set computer (RISC), an application specific integrated circuit (ASIC), a logic circuit, and any other circuit or processor capable of executing the functions described herein. The above examples are merely exemplary and thus are not intended to limit the definition and/or meaning of the term "computer" in any manner.

The instruction set may include various commands that instruct a computer acting as a processor or instruct a processor to perform particular operations, such as the methods and processes of various embodiments. The instruction set may be in the form of a software program, and the software program can form part of one or a plurality of tangible, non-transitory computer-readable media. The software may be in various forms such as system software or application software. In addition, the software may be in the form of a set of independent programs or modules, a program module within a larger program, or part of a program module. The software may also include modular programming in the form of object-oriented programming. The input data may be processed by the processor in response to an operator command, or in response to a previous processing result, or in response to a request made by another processor.

Some exemplary embodiments have been described above; however, it should be understood that various modifications may be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementations also fall within the protection scope of the claims.

The invention claimed is:

1. A monitoring method for a magnetic resonance imaging system, comprising:
acquiring a whole body specific absorption rate of a subject under examination;
acquiring a ratio between a local region specific absorption rate and the whole body specific absorption rate of the subject under examination on the basis of current parameter information of the local coupling coil in a magnetic resonance imaging system;
calculating the local region specific absorption rate of the subject under examination on the basis of the ratio and the whole body specific absorption rate; and
reducing the local region specific absorption rate of the subject under examination by controlling a body coil.

2. The monitoring method according to claim 1, wherein the acquiring a ratio between a local specific absorption rate and the whole body specific absorption rate of the subject under examination on the basis of current parameter information of a local coupling coil in the magnetic resonance imaging system comprises:
acquiring the current parameter information of the local coupling coil; and
acquiring, on the basis of predetermined correspondences between parameter information and ratios, the ratio corresponding to the current parameter information of the local coupling coil.

3. The monitoring method according to claim 2, wherein the correspondences are predetermined by electromagnetic simulation.

4. The monitoring method according to claim 1, wherein the parameter information of the local coupling coil comprises the size of the local coupling coil.

5. The monitoring method according to claim 1, wherein the parameter information of the local coupling coil comprises position information of the local coupling coil in the magnetic resonance imaging system.

6. The monitoring method according to claim 5, wherein the position information of the local coupling coil in the magnetic resonance imaging system is acquired on the basis of the center of a region of interest in a pre-scan image.

7. The monitoring method according to claim 5, wherein the position information of the local coupling coil in the magnetic resonance imaging system is acquired on the basis of switch signals triggered when the local coupling coil is installed at different positions on a scanning table.

8. The monitoring method according to claim 1, wherein before the acquiring a ratio between a local region specific absorption rate and the whole body specific absorption rate, the method further comprises:
determining whether an implant is present in the subject under examination, and if so, prompting a user to install the local coupling coil on the scanning table.

9. The monitoring method according to claim 8, wherein before the acquiring a ratio between a local region specific absorption rate and the whole body specific absorption rate, the method further comprises:
determining whether the local coupling coil is installed on the scanning table, and if the local coupling coil is installed on a scanning panel, acquiring the ratio between the local region specific absorption rate and the whole body specific absorption rate of the subject under examination.

10. The monitoring method according to claim 9, wherein the determining whether the local coupling coil is installed on the scanning table comprises: determining whether the local coupling coil is installed on the basis of the magnitude of radio frequency power required to complete a scan.

11. The monitoring method according to claim 9, wherein the determining whether the local coupling coil is installed on the scanning table comprises: determining whether the local coupling coil is installed on the basis of a switch signal triggered in response to installation of the local coupling coil on the scanning table.

12. The monitoring method according to claim 1, further comprising:
displaying the local region specific absorption rate and the whole body specific absorption rate.

13. A non-transitory computer-readable storage medium for storing a computer program, wherein the computer program, when executed by a computer, allows the computer to implement the monitoring method for a magnetic resonance imaging system according to claim 1.

14. A monitoring device for a magnetic resonance imaging system, comprising:
an acquisition module configured to acquire a whole body specific absorption rate of a subject under examination, and to acquire a ratio between a local region specific absorption rate and the whole body specific absorption rate of the subject under examination on the basis of current parameter information of a local coupling coil in a magnetic resonance imaging system;
a calculation module configured to calculate the local region specific absorption rate of the subject under examination on the basis of the ratio and the whole body specific absorption rate; and
a control circuit to control the body coil for reducing the local region specific absorption rate of the subject under examination.

15. The monitoring device according to claim 14, wherein the acquisition module is further configured to:

acquire the current parameter information of the local coupling coil; and
acquire, on the basis of predetermined correspondences between parameter information and ratios, the ratio corresponding to the current parameter information of the local coupling coil.

16. The monitoring device according to claim 14, wherein the parameter information of the local coupling coil comprises the size of the local coupling coil.

17. The monitoring device according to claim 14, wherein the parameter information of the local coupling coil comprises position information of the local coupling coil in the magnetic resonance imaging system.

18. The monitoring device according to claim 14, further comprising:
a first determination module configured to determine whether an implant is present in the subject under examination, and to prompt a user to install the local coupling coil on a scanning table if the implant is present in the subject under examination.

19. The monitoring device according to claim 18, further comprising:
a second determination module configured to determine whether the local coupling coil is installed on the scanning table, and to acquire the ratio between the local region specific absorption rate and the whole body specific absorption rate of the subject under examination if the local coupling coil is installed on a scanning panel.

20. The monitoring device according to claim 14, further comprising:
a display module configured to display the local region specific absorption rate and the whole body specific absorption rate.

21. A magnetic resonance imaging system, comprising:
a local coupling coil; and
the monitoring device according to claim 14.

22. The magnetic resonance imaging system according to claim 21, wherein the local coupling coil is configured to concentrate a radio frequency field generated by a body coil in a local region in an imaging space.

* * * * *